United States Patent
Biber

(10) Patent No.: US 9,664,766 B2
(45) Date of Patent: May 30, 2017

(54) RECORDING OF CALIBRATION DATA FOR A MAGNETIC RESONANCE SYSTEM

(71) Applicant: Stephan Biber, Erlangen (DE)

(72) Inventor: Stephan Biber, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 1252 days.

(21) Appl. No.: 13/631,638

(22) Filed: Sep. 28, 2012

(65) Prior Publication Data

US 2013/0076353 A1    Mar. 28, 2013

(30) Foreign Application Priority Data

Sep. 28, 2011 (DE) ........................ 10 2011 083 599

(51) Int. Cl.
  *G01R 35/00* (2006.01)
  *G01R 33/385* (2006.01)
  *G01R 33/58* (2006.01)
  *G01R 33/3415* (2006.01)

(52) U.S. Cl.
  CPC ........ *G01R 33/583* (2013.01); *G01R 33/3415* (2013.01)

(58) Field of Classification Search
  CPC ........................ G01R 33/3415; G01R 33/583
  USPC ........ 324/307, 309, 318, 322; 307/112, 113, 307/147; 600/422
  See application file for complete search history.

(56) References Cited

U.S. PATENT DOCUMENTS

| | | |
|---|---|---|
| 5,471,142 A | 11/1995 | Wang |
| 7,251,521 B2 | 7/2007 | Seeber |
| 8,148,983 B2 | 4/2012 | Biber et al. |
| 2005/0107685 A1 | 5/2005 | Seeber |
| 2009/0237081 A1 | 9/2009 | Biber et al. |
| 2009/0302845 A1* | 12/2009 | Biber ............... G01R 33/3415 324/318 |
| 2010/0225317 A1 | 9/2010 | Biber |

FOREIGN PATENT DOCUMENTS

| | | |
|---|---|---|
| CN | 101539614 A | 9/2009 |
| DE | 103 13 004 B3 | 1/2005 |
| DE | 10 2008 036 496 A1 | 2/2010 |

(Continued)

OTHER PUBLICATIONS

Chinese office Action for related Chinese Application No. 201210369282.3 dated Jan. 5, 2016, with English Translation.

(Continued)

*Primary Examiner* — Melissa Koval
*Assistant Examiner* — Rishi Patel
(74) *Attorney, Agent, or Firm* — Lempia Summerfield Katz LLC

(57) ABSTRACT

A local coil with a plurality of magnetic resonance antenna elements and a plurality of test signal coupling units assigned individually or in groups to the plurality of magnetic resonance antenna elements is provided. In order to transmit a test signal, each test signal coupling unit of the plurality of test signal coupling units is connected via a star connection unit to a joint test signal connector and/or to a transmission cable of a transmit and/or receive chain of an assigned magnetic resonance antenna element of the plurality of magnetic resonance antenna elements.

6 Claims, 6 Drawing Sheets

(56) References Cited

FOREIGN PATENT DOCUMENTS

DE 10 2009 012 109 A1 9/2010
JP H06261880 A 9/1994

OTHER PUBLICATIONS

German Office Action dated Jul. 12, 2012 for corresponding German Patent Application No. DE 10 2011 083 599.7 with English translation.

* cited by examiner

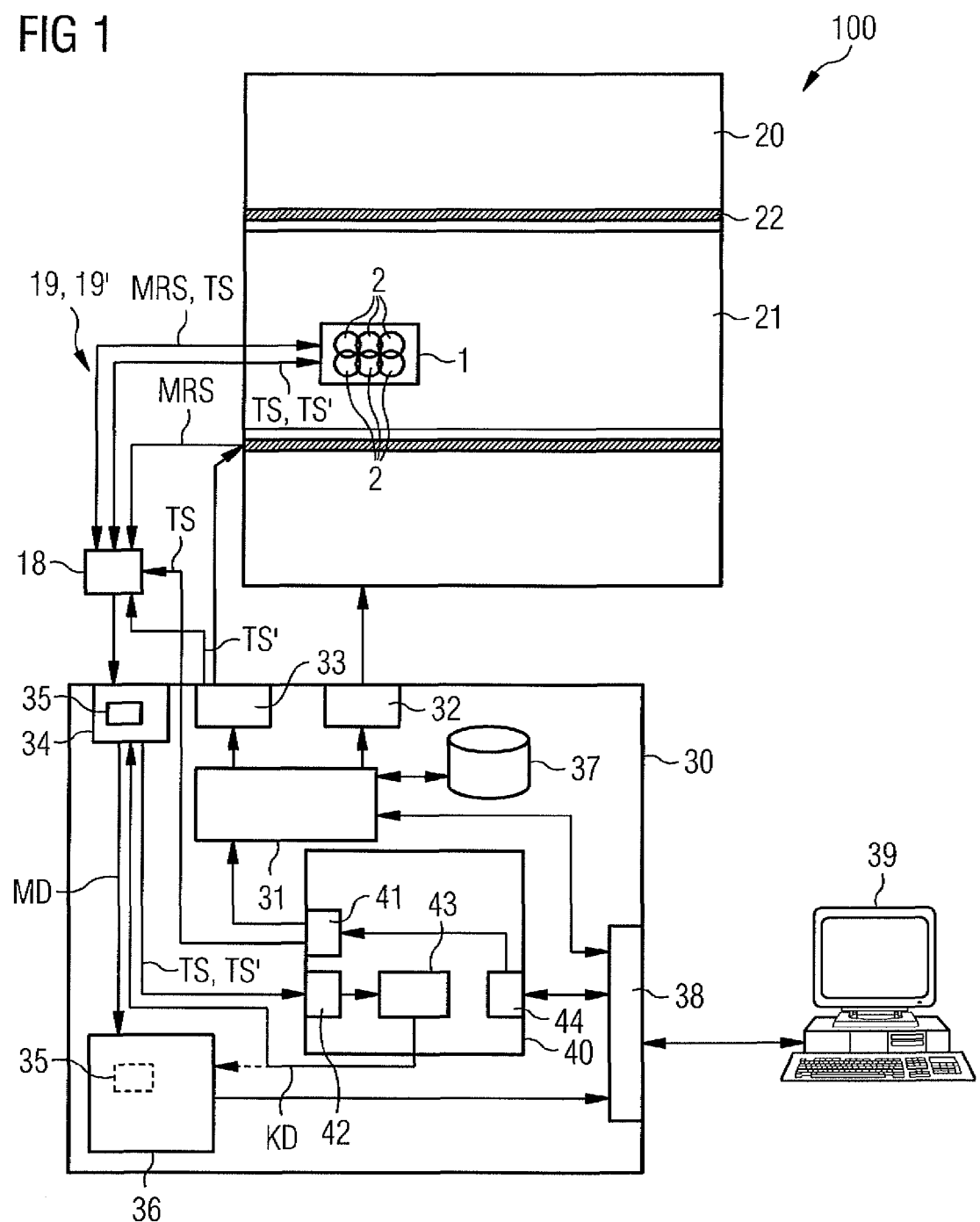

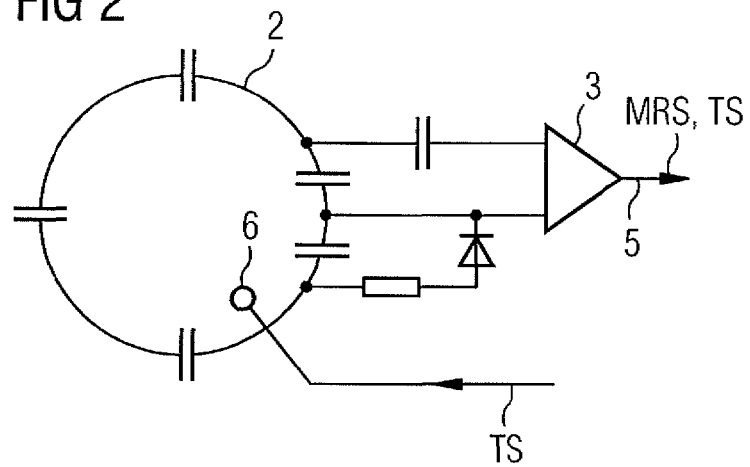
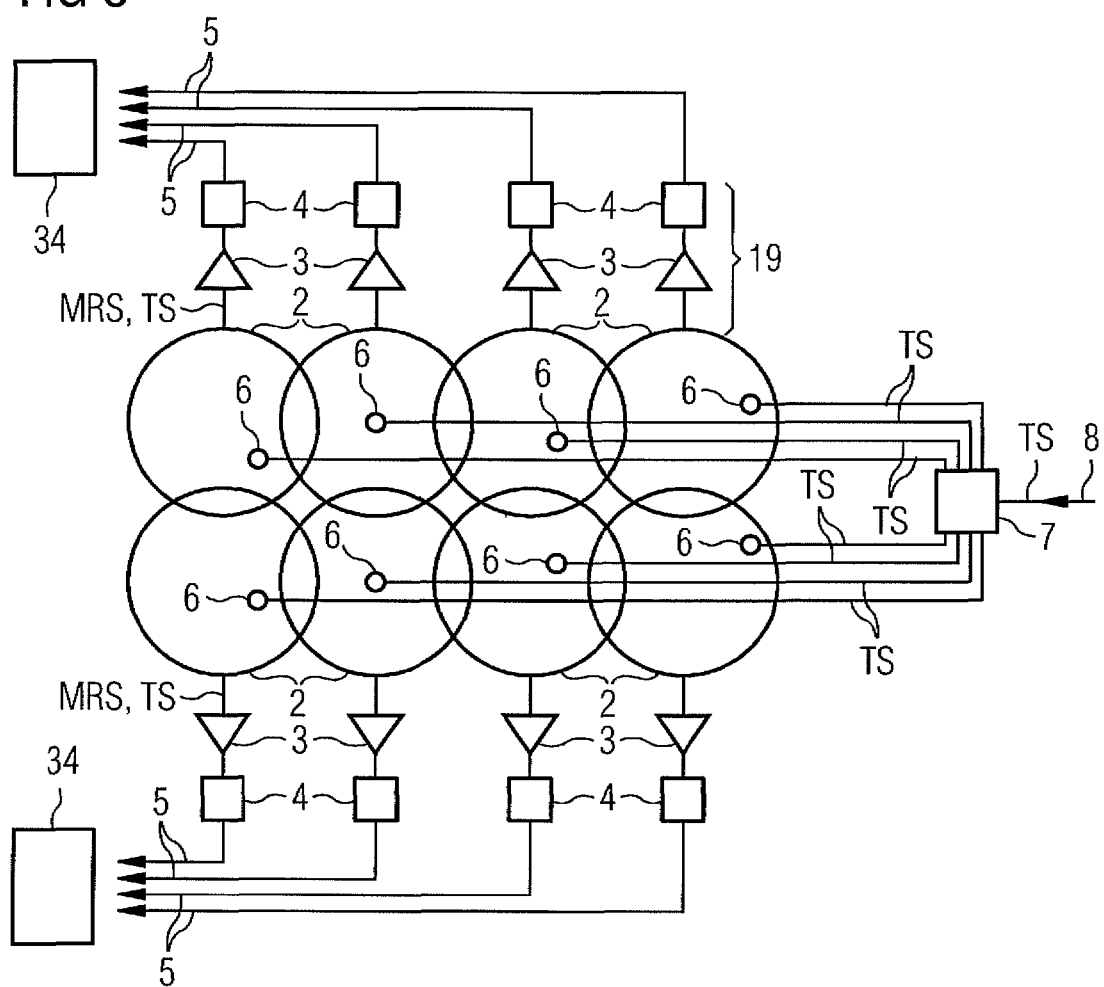

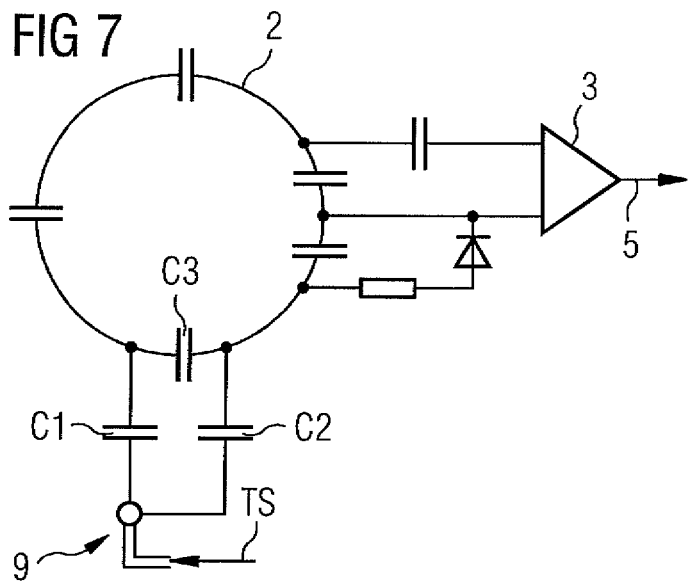
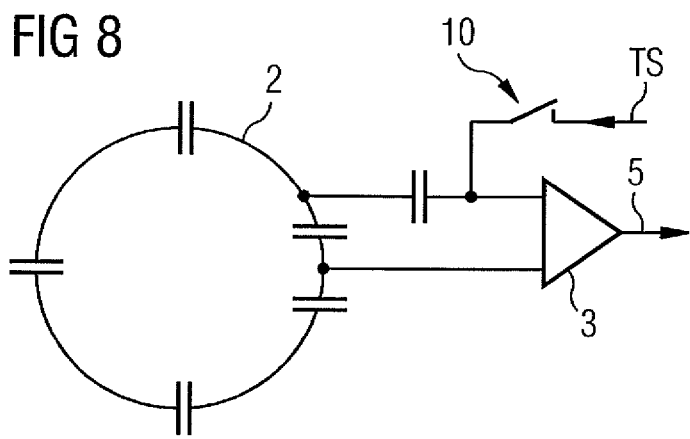
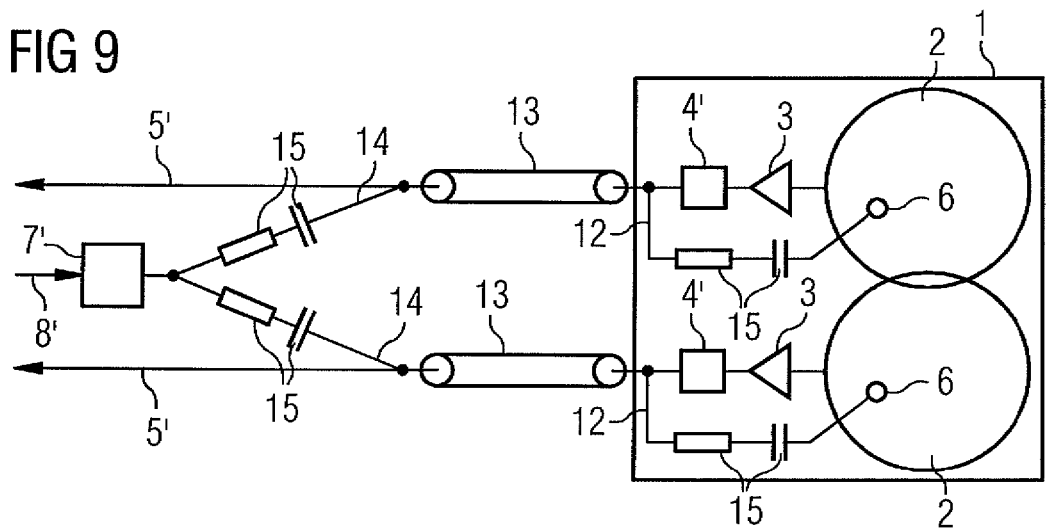

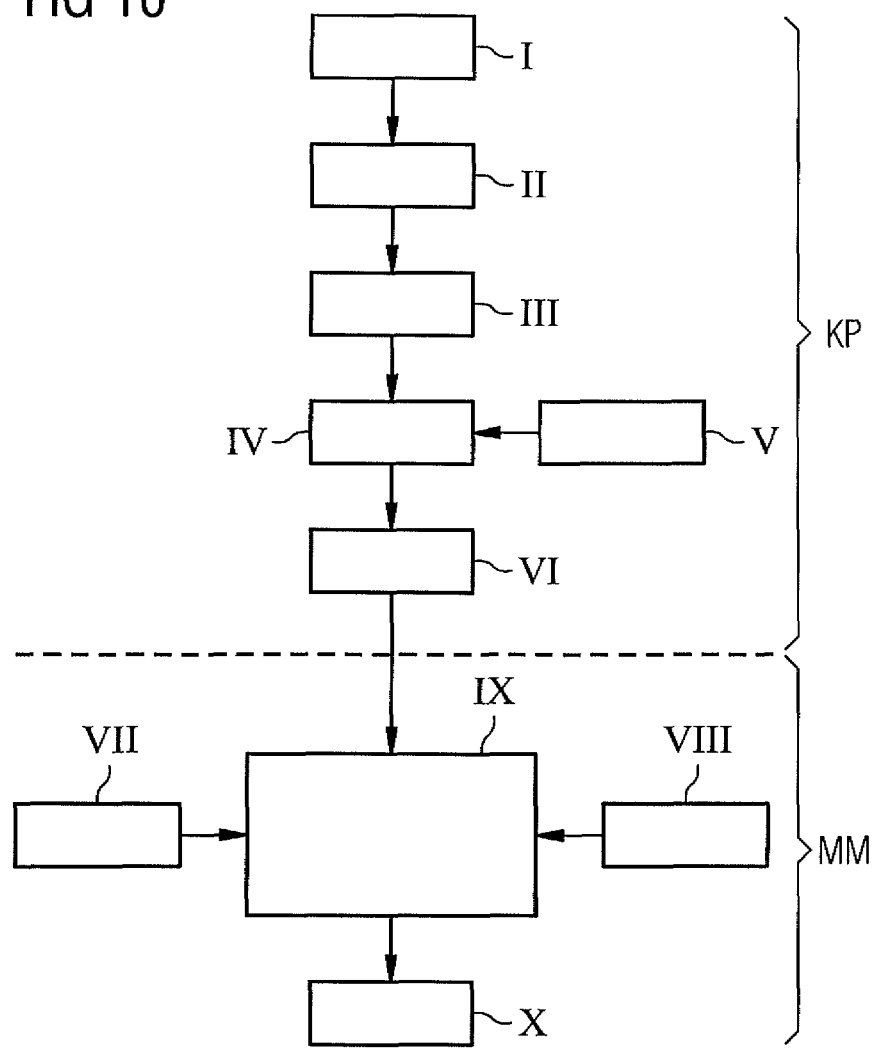

RECORDING OF CALIBRATION DATA FOR A MAGNETIC RESONANCE SYSTEM

This application claims the benefit of DE 10 2011 083 599.7, filed on Sep. 28, 2011

BACKGROUND

The present embodiments relate to a local coil for a magnetic resonance system with a plurality of magnetic resonance antenna elements.

Magnetic resonance tomography is a widely used procedure for obtaining internal images of the body. In this procedure, the body to be investigated is exposed to a relatively high base magnetic field (e.g., 1.5 tesla, 3 tesla or more). A high-frequency excitation signal (e.g., the $B_1$ field) is emitted with an antenna device, where the nuclear spins of certain atoms that are resonantly stimulated by this high-frequency field are tilted by a defined flip angle with respect to the magnetic field lines of the base magnetic field. The high-frequency signal emitted during the nuclear spin relaxation (e.g., the "magnetic resonance signal") is then collected with suitable antenna arrangements. The raw data thus acquired is then used to reconstruct the image data. Magnetic field gradients defined respectively during the transmission and the reading or reception of the high-frequency signals are superimposed on the base magnetic field for the purpose of spatial encoding.

Magnetic resonance antenna arrangements for receiving magnetic resonance signals may be antenna arrangements that are also used for emission of the $B_1$ field. A "whole-body coil" (e.g., a "whole-body antenna" or a "body coil") may be installed in the scanner unit, in which the magnetic resonance measuring space (e.g., implemented in the form of a patient tunnel) is located, for transmission of the $B_1$ field. The "whole-body coil" may be configured so that the coil emits a homogeneous $B_1$ field in as large an area as possible inside the magnetic resonance measurement space.

"Local coils" are also used in many investigations. During the investigation, the local coils are positioned relatively close to the surface of the body, directly over an area of interest to be investigated (e.g., a specific organ or part of the body). Because of the close proximity to the areas of interest, the noise level caused by the electrical losses within the object of investigation is reduced, so that the signal-to-noise ratio (SNR) of a local coil may be better than the SNR of a more distantly located antenna. An individual antenna element (e.g., in the form of a single conductor loop with a preamplifier) is, however, only able to generate an effective image within a certain area extending approximately over the diameter of the conductor loop. Therefore, to minimize the measurement time with parallel imaging, most local coils are designed as "multichannel coils" with a plurality of individual magnetic resonance antenna elements (e.g., MR antenna elements; many individual conductor loops arranged alongside or overlapping one another in the form of a matrix, each having a corresponding preamplifier).

In order, for example, also to be able to use parallel imaging facilities such as SENSE and GRAPPA procedures, local coils with more and more channels are being developed. Local coils with up to 32 channels or individual antenna elements are used currently. Local coils with up to 128 channels are in planning or being tested. Such local coils may be mechanically constructed in any way, for example, as relatively flexible, flat antenna arrangements that are placed over, under or on the object of investigation. Additionally or alternatively, the local coils may be mechanically constructed as stable, cylindrical constructions for use as head coils or similar. Local coils may be used not only for receiving magnetic resonance signals, but also, with suitable wiring of the MR antenna elements, for emitting the high-frequency signals for excitation.

A high number of receive channels uses a high number of receivers on the side of the magnetic resonance system's receiving device. The receiving device may be, in the following, be the complete unit of the magnetic resonance system with several individual receiving channels, in which the received raw data is amplified and, for example, decoded, separated and finally digitized. The data then exists as raw digital data for the reconstruction of image data.

To enable local coils with a higher number of MR antenna elements to be used even with a lower number of receiving channels in the magnetic resonance system, switch matrices (e.g., receive coil switch (RCCS)) and mode matrices may be used. A switch matrix is a piece of hardware that automatically switches the outputs of the currently active MR antenna elements to specific outputs, to which the individual receiving channels of the receiving device are connected. A mode matrix may be a circuit configuration that connects adjacent receiving channels together into "modes." This is a combination circuit of phase shifters and hybrids that combine the signals according to magnitude and phase so that N modes are generated from N input signals of N MR antenna elements. This signal combination may, for example, already take place in the local coil if a mode matrix circuit is integrated. The first mode (e.g., primary mode or CP mode) already contains the main image information and provides the maximum SNR at the center of the region of interest (ROI) of the patient's body. The higher modes (e.g., secondary mode and the tertiary mode) increasingly provide SNR in peripheral areas of the body and serve to improve the quality of the image and facilitate the use of parallel imaging techniques such as SENSE and GRAPPA. The sum of all mode signals in total contains the same information as the original signals of the individual MR antenna elements. Such a mode matrix is described, for example, in DE 103 13 004.

Because of technical developments, the individual receive channels of the receiving device may be implemented far more cost-effectively in the future. This will provide that using a mode matrix circuit for the purpose of reducing channels will no longer be worthwhile. Secondly, mode formation also has other advantages, since mode formation enables magnetic resonance images to be generated that have a relatively low sensitivity to the patient's skin surface. This is particularly advantageous for reducing motion artifacts (e.g., in the case of high channel coils with a very large number of relatively small MR antenna elements).

In order to be able to generate modes despite the absence of a mode matrix circuit behind the local coils, a digital mode formation may be useful. In this case, the magnetic resonance signals received by the MR antenna elements after the digitization, for example, may also be linked into modes using suitable software or simple FPGAs or ASICs, or similar.

SUMMARY AND DESCRIPTION

One problem with the prior art, however, is that the individual MR antenna elements are sometimes transferred with different phase delays via the assigned receive chains, which may ultimately lead to errors in the mode formation. Correspondingly expensive mode matrix circuits continue to be used.

The present embodiments may obviate one or more of the drawbacks or limitations in the related art. For example, a suitable local coil, a magnetic resonance system and suitable methods, with which this problem may be resolved, are provided.

One embodiment of a local coil for such a magnetic resonance antenna arrangement of a magnetic resonance system has a plurality of individual MR antenna elements. MR antenna elements are defined, for example, as the antenna elements that are used for receiving the magnetic resonance signals or via which the high-frequency signals are emitted for excitation, where appropriate. In one embodiment, such a local coil has a plurality of test signal coupling units each assigned individually or in groups to the MR antenna elements. In order to transmit a test signal, the test signal coupling units are each connected via a star connection unit with a joint test signal connector of the local coil and/or with a transmission cable of a transmit and/or receive chain of an assigned magnetic resonance antenna element. This star connection unit is, for example, a suitable circuit that is able to distribute a test signal fed in at the test connector to the individual test signal coupling units or, conversely, to recombine (e.g., to superimpose) the signals received via the individual test signal coupling units, so that the received signals may be output, for example, at the test signal connector of the local coil.

Such a local coil is used in a magnetic resonance system, with the MR antenna elements of the local coil each being connected via a receive chain to a receiver of the magnetic resonance systems and/or via a transmit chain to a high-frequency transmission device of the magnetic resonance system. The magnetic resonance system also has a test signal transmission interface that, in a calibration operation, injects, via the test signal coupling units, a defined test signal into the MR antenna elements or, conversely, causes the emission of a defined test signal by the MR antenna elements in each case via the transmit chain assigned to the magnetic resonance antenna element. The magnetic resonance system also has a test signal receiving interface that, in the calibration operation, receives the test signals injected via the test signal coupling units into the respective MR antenna elements or the test signals emitted by the MR antenna elements and detected by the respective test signal coupling units. An analysis unit is used in order to determine the current relative phase responses of the receive chains of the individual MR antenna elements on the basis of the test signals injected into the MR antenna elements and/or to determine the current relative phase responses of the transmit chains of the individual MR antenna elements on the basis of the test signals detected by the respective test signal coupling units.

Determining the relative phase responses of the receive chains or the transmit chains may be, for example, determining the necessary information as to how the phases relate to one another via the individual receive chains or transmit chains (e.g., with which relative phase shift a test signal via one receive chain is delayed in relation to the other receive chain). On the basis of this information, a correction of the signals is then possible in order to deduct the different phase responses again retrospectively. A receive chain of an MR antenna element may be the entire signal path, starting from the MR antenna element, via preamplifier, postprocessing, demodulator, etc., through which the analog magnetic resonance signal runs until the magnetic resonance signal is digitized by the analog/digital converter. This is regardless of whether the analog/digital converter is arranged in the receiving device of the magnetic resonance system, and the magnetic resonance signals are transferred in analog form from the local coil to the receiving device, or whether the analog/digital converter is already arranged in the local coil. The transmit chain is the complete analog signal path on the transmit side, starting from a digital/analog converter of the high-frequency transmission device, via the mixers, amplifiers, etc., to the MR antenna element in the local coil.

In one embodiment of a method for recording calibration data of such a magnetic resonance system with one embodiment of a local coil, a defined test signal, for example, is first injected via a plurality of test signal coupling units into the MR antenna elements of the local coil. This test signal is fed in at a joint test signal connector and distributed via a star connection unit in the local coil to the test signal coupling units, and/or the test signal is transferred to the test signal coupling units via a transmission channel of a receive chain of a magnetic resonance antenna element that is assigned to the test signal coupling unit. If the test signals that were injected into the MR antenna elements and sent back to the receiving device via the receive chains assigned to the respective MR antenna elements are then received, the current relative phase responses of the receive chains of the individual MR antenna elements may be determined on this basis.

In the same way, a defined test signal may be emitted by the respective MR antenna elements via the transmit chain, assigned to the respective magnetic resonance antenna element. These test signals emitted by the MR antenna elements are detected by the respective test signal coupling units and linked (e.g., superimposed) in a star connection unit (e.g., in the local coil) and output at a joint test signal connector. Alternatively or in addition, test signals may also be transferred via a transmission cable of a transmit chain of one of the magnetic resonance antenna elements assigned to the test signal coupling unit. On the basis of these test signals, the current relative phase responses (e.g., the information about the relative phase shifts) of the transmit chains of the individual MR antenna elements are determined.

The test signal used may be a high-frequency signal (e.g., in the range of the magnetic resonance frequency that is also otherwise received with the MR antenna elements during the magnetic resonance measurements) or may be transmitted by the high-frequency signal. A suitable test signal may include a plurality of partial test signals that are emitted to different MR antenna elements. The partial test signals have a certain relative phase relationship to one another, so that the partial test signals may be regarded as a joint test signal in relation to the phase responses.

This method for recording calibration data may be used in an embodiment of a method for generating measurement data with the corresponding magnetic resonance system. The current relative phase responses of the receive chains and/or transmit chains of the MR antenna elements of the local coil determined in the calibration phase are used for this purpose in order to modify and/or correct the measurement data acquired in a magnetic resonance measurement.

The method has a multitude of advantages. For example, a calibration of the entire receive chain or transmit chain may be provided using a high-frequency technical measurement without any magnetic resonance image experiment. The method is thus not only easy to implement, but is also robust, since the method is not susceptible to problems of image processing such as magnetic resonance artifacts, etc. Any costly measurement and apportionment of the phase responses of individual components (e.g., the cable), the lines, or the preamplifiers of the receive chain or transmit chain is not necessary.

Since the method may be carried out immediately before the magnetic resonance measurement after positioning on the patient, the calibration is carried out under realistic load conditions in contrast to other imaging methods, so that the method may respond flexibly to the load situation as well as to the anatomy of the patient and the position of the coils relative to the patient. The transmission phase of the pre-amplifier may also be dependent, inter alia, on the loading situation, since this helps to define the input reflection factor that the preamplifier "sees" going into the antenna.

Since only relatively little priori knowledge is required (e.g., information about the relative phase responses on the test signal lines (from the test signal transmission device or test signal receiving device to the test signal coupling units)), the calibration expenditure is low. These relative phase responses on the test signal lines may, however, easily be measured for the respective local coil beforehand.

The measurements may be carried in under 10 ms approximately, so that virtually no time is to be spent on this in the course of a complete magnetic resonance measurement. For example, such measurements may be carried out several times in order to take into account the current correct phase responses at any time, even if, for example, the patient has moved during a session, and the local coils have assumed a slightly different shape as a result.

For example, the use of a plurality of test signal coupling elements and the direct assignment to the MR antenna elements enables mechanically flexible local coils to be used, since the position of the test signal coupling units and the MR antenna elements to one another is fixed, and thus, the coupling factor is also defined. This offers a great advantage compared to conventional methods, in which a test signal is emitted with an external coil (e.g., the whole-body coil), or with an individual test antenna integrated in the local coil, and this signal is received and finally evaluated by all MR antenna elements. Herein lies the disadvantage that a defined transmission route is not always established between the antenna that emits the test signal and the MR antenna elements, so that unknown phase responses occur even before the test signal is injected into the MR antenna elements. This makes any clear definition of the relative phase responses of the receive chains of the MR antenna elements to one another not possible. If a local coil is used with its own test antenna, such unknown phase shifts occur, for example, if moldable local coils that are to be adapted to the patient during operation are used. This causes a position shift between the test antenna and such MR antenna elements that are located in the local coil further from the test antenna. This problem may be avoided by the use of one embodiment of the local coil with a plurality of test signal coupling units assigned individually or in groups to the MR antenna elements.

One category of the present embodiments may also be developed according to another category of the present embodiments.

The test signal coupling units may, for example, be configured in various ways (e.g., a capacitively operating test signal coupling unit). For example, a conductive path of the test signal coupling unit overlaps with a conductor of the MR antenna elements or where a test signal conductor is connected to a conductor of the magnetic resonance antenna element via a capacitive element with relatively low capacity (e.g., below 2 pF). A test signal coupling unit may be implemented with the galvanic connection of a test signal cable via a switch (e.g., at the input of the preamplifier directly on the magnetic resonance antenna element).

In one embodiment, each of at least a part of the test signal coupling units (e.g., all test signal coupling units) includes a test antenna that links inductively with the assigned magnetic resonance antenna element.

The test antennas may be arranged so that the MR antenna elements overlap the respective test antennas assigned to the MR antenna elements. This makes it easy to provide that the phase response between the test antenna and the assigned magnetic resonance antenna element remains essentially unchanged in the event of any movement and reshaping of the local coils.

In one embodiment, a test antenna that is assigned to a group of MR antenna elements is accordingly arranged in a joint overlapping area of the MR antenna elements of the group. With this design, the number of test antennas may be reduced, while implementing an optimal assignment of a test antenna to each magnetic resonance antenna element.

A local coil may also include at least one test antenna arranged in a marginal area of the local coil and connected to the star connection unit of the local coil. The local coil may also include a position marking that defines an overlap, in which the local coil is to overlap with an adjacently arranged local coil, so that a defined coupling of the test antenna with a magnetic resonance antenna element of the adjacently arranged local coil is effected during operation. In the calibration operation, when a plurality of adjacently arranged local coils are used on the patient, using the test signal antenna arranged in the marginal area of the first local coil, a defined test signal may be injected into the magnetic resonance antenna element of the adjacently arranged second local coil. Conversely, using the test antenna, a test signal emitted from the magnetic resonance antenna element of the adjacently arranged local coil may be received. The relative phase responses of the receive chains and/or transmit chains of the MR antenna elements of the first and second local coils to one another may be determined. For this purpose, the operator may provide that the first and second local coils are positioned with a defined overlap in relation to one another. This may be achieved relatively easily with the help of position marking.

The magnetic resonance signals of the MR antenna elements of a local coil may be linked to one another and, for example, digital modes may be formed from the magnetic resonance signals. In one embodiment, the MR antenna elements of different adjacent local coils (e.g., all local coils used during a measurement) may be linked to one another, since the relative phase responses to one another may be determined for all MR antenna elements or the assigned receive chains and/or transmit chains.

The measurement data acquired as raw data by the MR antenna elements is transmitted respectively via a receive chain assigned to the individual MR antenna elements, to an assigned analog-digital converter of the receiving device and digitized by the assigned analog-digital converter. Receive modes may be formed on the basis of the digitized measurement data. Using the determined relative phase responses, a digital correction takes place during this mode formation. For this purpose, on the basis of the current relative phase responses of the receive chains and/or transmit chains determined in the calibration phase, a current phase correction matrix is produced for the MR antenna elements or receive chains or transmit chains. This phase correction matrix may be stored in a memory, so that the phase correction matrix may be used at any time during a magnetic resonance measurement in order to permit the digital mode formation, for example.

BRIEF DESCRIPTION OF THE DRAWINGS

FIG. 1 shows one embodiment of a magnetic resonance system;

FIG. 2 shows one embodiment of a magnetic resonance antenna element with an assigned inductive test signal coupling unit in the form of a test antenna;

FIG. 3 shows a first exemplary embodiment of a local coil with a plurality of MR antenna elements and assigned test antennas;

FIG. 7 shows an exemplary embodiment of a magnetic resonance antenna element with an assigned capacitive test signal coupling unit;

FIG. 8 shows an exemplary embodiment of a magnetic resonance antenna element with an assigned galvanic test signal coupling unit;

FIG. 9 shows an exemplary embodiment of a magnetic resonance antenna element with a plurality of MR antenna elements and assigned test antennas that are each connected to a transmission cable of a transmit and/or receive chain of the assigned magnetic resonance antenna element; and FIG. 10 is a flow chart showing a sequence of one embodiment of a method.

DETAILED DESCRIPTION OF THE DRAWINGS

Figure 4:
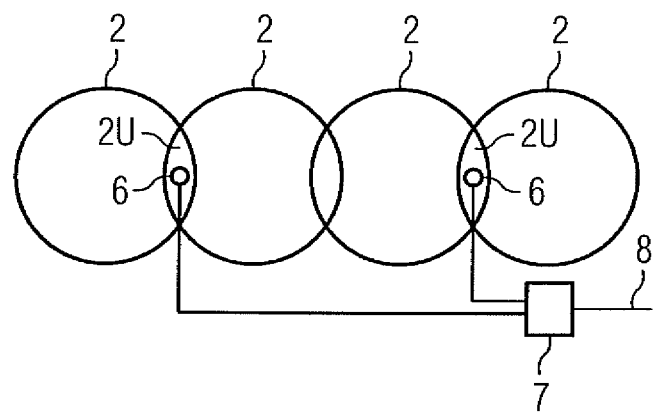
FIG. 4 shows a second exemplary embodiment of a plurality of MR antenna elements with assigned test antennas.

FIG. 1 is a diagram showing one embodiment of a magnetic resonance system 100.

The magnetic resonance system 100 includes an actual magnetic resonance scanner unit 20, in which an object of investigation or a patient or study volunteer (not shown) is positioned on a patient couch (not shown) in a magnetic resonance measurement space 21 or patient tunnel 21 during an investigation. The magnetic resonance-scanner unit 20 includes a number of components. These components include a base magnetic field generation unit that provides that as homogeneous a base magnetic field as possible is present inside the patient tunnel 21. The magnetic resonance-scanner unit 20 further includes gradient coils, with which a magnetic field gradient may be applied in a defined way inside the patient tunnel 21, and a whole-body antenna 22, via which high-frequency fields may be emitted into the patient tunnel 21.

In addition to the components already mentioned, of which for reasons of clarity, only the whole-body antenna 22 is schematically illustrated in FIG. 1, the magnetic resonance-scanner unit 20 may also include a number of further components (e.g., a shim system) in order to improve the homogeneity of the base magnetic field, a monitoring system for general monitoring tasks, etc.

The scanner unit 20 is controlled by a control device 30. Only components that are used to explain the present embodiments are shown in FIG. 1. Such magnetic resonance systems 100 and the associated control devices 30 may be known to a person skilled in the art and therefore are not explained in detail.

A majority of the control device 30 shown in FIG. 1 is implemented in the form of software modules on one or more processors within a housing of the control device 30. Such a control device may, however, also include a plurality of spatially distributed and suitably internetworked components or modules.

The control device 30 has, for example, different interfaces (e.g., a terminal interface 38), with which the control device 30 is connected to a terminal 39 for the operator. This terminal 39 may have an operator interface (e.g., a keyboard and screen) and may have a pointer device (e.g., a mouse or similar), so that the operator also has a graphical user interface available.

Further interfaces are a high-frequency transmission device 33 (e.g., an HF transmission device) that, for example, represents the complete high-frequency transmission path of the magnetic resonance system 100, and a receiving device 34 that includes a plurality of magnetic resonance signal receive channels (not shown individually in FIG. 1).

Via the HF transmission device 33, for example, the whole-body coil 22 in the scanner unit 20 is controlled, or suitable high-frequency pulse sequences are generated, in order to excite the nuclear spins in the required way. For this purpose, the HF transmission device 33 has one or more digital pulse generation units and suitable digital/analog converters, in order to generate a digital signal for the pulse shape. The HF transmission device 33 also includes, for example, mixers and high-frequency amplifiers in order to generate, on the basis of the digital signal, a high-frequency signal with appropriate strength, shape and frequency.

As shown in Figure, the high-frequency pulse sequences may be emitted by the HF transmission device 33 to a local coil 1 that is positioned for a magnetic resonance measurement on a patient or study volunteer lying in the patient tunnel 21. The local coil 1 has, for example, a plurality of MR antenna elements 2. Assemblies of different local coils 1 will be explained later in detail on the basis of the further diagrams.

As a further interface, the control device 10 has a control interface 32 for the other components of the scanner unit 20, via which, for example, the above-mentioned gradient coils are controlled. This may include a plurality of interfaces that, purely for reasons of simplicity, are combined into one interface block in FIG. 1. The control interface 32 and the high-frequency transmission interface 33 are controlled by a measurement control unit 31 that, according to precisely predefined measurement protocols that are stored, for example, in a memory 37 and/or may be predefined or modified via the terminal 39, provides that the gradient pulse sequences and high-frequency pulse sequences used for a defined magnetic resonance measurement are emitted.

The HF receiving device 34 is connected via a switching device 18 to the whole-body coil 22 and to the local coil 1. This switching device also enables the local coil 1 to be switched from a receive mode, in which magnetic resonance signals MRS are received, to a transmit mode, in which HF signals may be emitted by the HF transmission device 33 via the local coil 1 for excitation.

In the transmission case, a corresponding high-frequency signal is transmitted via the HF transmission device 32 to the switching device 18 and from there, via the corresponding cables into the MR antenna elements 2 of the local coil 1.

The complete transmission path starting from the digital/analog converter of the HF transmission device 34 via the mixers, amplifiers and the switching device 18 to the MR antenna elements is designated as transmit chain 19'.

In the receiving case, the magnetic resonance signals MRS received by the MR antenna elements 2 in the local coil are amplified and preprocessed locally, transmitted via suitable cable to the switching device 18 and forwarded to the HF receiving device 34 receive channel assigned in the respective magnetic resonance antenna element 2. For this purpose, the HF receiving device 34 has a plurality of receive channels, one receive channel respectively for each of the MR antenna elements 2. These receive channels may be constructed in the usual way (e.g., if the magnetic resonance signals are transmitted in analog form from the local coil 1 to the HF receiving device 34, using various demodulators in order to filter out the required information from the magnetic resonance signals according to frequency, and analog/digital converters in order to digitize the raw data). The receive chain 19 runs from the MR antenna elements 2 to the respective analog/digital converters in the receive channels of the receiving device 34. Alternatively, in newer local coils 1, the analog/digital converters for each MR antenna element 2 may already be arranged in the local coil 1 itself, so that the receive chain 19 only extends in the local coil. The receiving device 34 with receive channels is then implemented as a digital processor (e.g., using FPGAs and/or DSPs).

The raw data received by the individual receive channels of the HF receiving device 34 is then forwarded to an image reconstruction unit 36 that reconstructs magnetic resonance images in the usual way from the digitized raw data. The reconstructed images may, for example, be output via the terminal interface 38 on a screen of the terminal 39 or stored in the memory 37. Alternatively, the control device 30 may also have an interface to a network or similar (not shown), so that raw data or image data may also be saved to external mass storage, or images and raw data may be transmitted to other processors (e.g., diagnostic centers) to enable, for example, the images to be viewed or printed.

In this exemplary embodiment, the HF receiving device also includes a digital mode formation unit 35, with which modes may, if necessary, be combined from the digitized raw data of the individual MR antenna elements 2, as the modes have been generated hitherto (in analog form) by the mode matrix circuits. This raw mode data MD may likewise be transmitted to the reconstruction device 36 and used at the reconstruction device 36 for the reconstruction of image data. Alternatively, the digital mode formation unit 35 may also be implemented in the reconstruction unit 36 (e.g., the digital modes are formed from the raw data only for the purposes of the reconstruction).

In one embodiment, the control device 30 additionally has a calibration unit 40. The calibration unit 40 includes a test signal transmission interface 41. A test signal TS in the form of a suitable high-frequency signal (e.g., with the Larmor frequency) may be generated via the test signal transmission interface 41 in a calibration operation and, for example, transmitted via the switching device 18 to test signal coupling units arranged in the local coil 1. The test signal coupling units are not shown in FIG. 1, but will be explained later with the help of FIGS. 2 to 9.

The test signal TS is injected into the respective MR antenna elements 2 of the local coil 1, and the test signal TS thus received is transmitted back again via the switching device 18 and the HF receiving device 34 and digitized. This provides that test signal TS runs through the entire receive chain 19 of a magnetic resonance antenna element 2. The digitized signal TS may be transmitted to a test signal receiving interface 42 of the calibration unit 40, which then transfers the test signal TS to an analysis unit 43. On the basis of the test signals TS received by the individual MR antenna elements 2, the analysis unit 43 may determine current relative phase responses of the receive chains 19 of the individual MR antenna elements 2, provided the phase responses of the transmission paths, starting from the test signal transmission interface 41 via the test signal coupling unit to the respective magnetic resonance antenna element 2, relative to one another are known. The relative phase responses or data generated from the relative phase responses (e.g., a phase correction matrix KD) may be transferred from the analysis unit 43 to the mode formation unit 35 in the HF receiving device 34 or into a digital mode formation unit 35 in the reconstruction unit 36, so that the relative phase responses may be taken into account in the mode formation.

Alternatively, the relative phase responses of the transmit chains 19' of the individual MR antenna elements 2 of the local coils 1 may be determined using this calibration unit 40. For this purpose, the test signal transmission interface 41 may output a corresponding transmit command to the measurement control unit 31. The HF transmission device 33 may then control the measurement control unit 31 so that a suitable test signal TS' is generated and transmitted via the switching device 18 to the local coil 1 or the individual MR antenna elements. Each transmitted test signal TS' is received by the test signal coupling units in the local coil 2 and sent back accordingly via the switching device 18 and the HF receiving device 34 to the test signal receiving interface 42. Since the relative phase responses on the return path starting from the test signal coupling unit to the test signal receiving interface 42 are known, the relative phase responses of the transmit chains 19' may be determined.

The calibration unit 40 has an interface 44 that is connected to the terminal interface 38, so that such a calibration process may be initiated by the operator, for example, via the terminal 39. However, such a calibration process may be automatically controlled while a measurement is in progress. The calibration unit 40 may thus be controlled by the measurement control unit 31.

FIG. 2 shows one embodiment of a test signal coupling unit 6 in the form of a test antenna 6 together with an assigned magnetic resonance antenna element 2 of a local coil. The magnetic resonance antenna element 2 may be configured as a conductor loop with a plurality of capacitive elements. At one point, a voltage that is induced in the magnetic resonance antenna element 2 upon receipt of a magnetic resonance signal is tapped via a capacitive element. The voltage signal is amplified in a preamplifier 3 and output as an analog magnetic resonance signal MRS at an output 5. One output of the preamplifier 3 is directly connected via a capacitive element to the conductor loop of the magnetic resonance antenna element 2, and a second input of the preamplifier 3 is connected directly to the conductor loop of the magnetic resonance antenna element 2 and connected to the conductor loop via a coil and a diode. The three connections on the conductor loop are each separated from one another by capacitive elements in the conductor loop. The test antenna 6 includes, for example, a simple, relatively small conductor loop that is located inside the larger conductor loop of the magnetic resonance antenna element 2. The conductor loop of the test antenna 6 is also completely overlapped by the assigned magnetic resonance antenna element 2 (e.g., lies inside the active receiving surface of the conductor loop of the magnetic resonance antenna element 2). When a test signal TS is fed into the test antenna 6, the test signal TS is captured by the magnetic resonance antenna element 2, and a test signal TS, which may be sent back via the output 5 to the receiving device of the magnetic resonance system, is accordingly present at the output of the preamplifier 3.

FIG. 3 shows one embodiment of a local coil 1. The local coil 1 has a total of eight MR antenna elements 2 that are each connected to a preamplifier 3 (the exact wiring is not shown in FIG. 3 for the sake of clarity; corresponds to the embodiment in FIG. 2). Behind each of the preamplifiers 3 is a postprocessing circuit 4, in which a frequency conversion of the received signals, a filtering and also a digitization may take place, so that digital magnetic resonance signals may be transferred to the receiving device 34 at the outputs 5. The receive chain 19 relevant for the calibration is consequently located completely in the local coil 2.

According to one embodiment, in the local coil 2, each individual magnetic resonance antenna element 2 is assigned a test antenna 6 that is arranged inside the conductor loop of the respective magnetic resonance antenna element 2. The test antennas 6 are each connected to a central star connection unit 7 in the local coil 2. The star connection unit 7 is connected to a test signal connector 8 of the local coil 2. Via the test signal connector 8, for example, a test signal TS may be fed in and distributed in the star connection unit 7 and transmitted via the individual test antennas 6. The star connection unit 7 is therefore constructed, for example, as a signal distributor (e.g., as an ordinary power splitter of the Wilkinson type with several 90° and/or 180° hybrids).

The relative phase shifts, which the test signal TS anticipates from the star connection unit 7 to the individual test antennas 6, are known and were determined beforehand for each local coil 2 in a simple calibration measurement. This data may, for example, be stored in a memory (not shown) in the local coil 2 or delivered with the local coil 2 with software, so that the data is known in the magnetic resonance system 100. If the data is stored in the local coil 2, the data may be retrieved from the magnetic resonance system 100 with an identifier of the local coil 2, as soon as the local coil 2 is connected to a receiving device 34 of the magnetic resonance system 100.

A joint test signal TS may therefore be transmitted via the test antennas 6. The joint test signal TS is then received by the respective MR antenna elements 2, amplified and postprocessed accordingly. The test signal TS is then transferred back via the connectors 5 to the receiving device of the magnetic resonance system, whereby, in the way previously described, the relative phase responses of the receive chains of the individual MR antenna elements 2 (e.g., the phase responses of the preamplifiers 3 and analog postprocessing components) may be precisely determined.

In a similar way, the relative phase responses of the transmit chains of the individual MR antenna elements 2 to one another may be determined, provided the local coil has appropriate circuits, so that high-frequency signals may also be transmitted via the MR antenna elements 2 for excitation of the nuclear spins. The emitted test signals are then received with the test antennas and assembled via the star connection unit, and delivered back via the test signal connector to the magnetic resonance system (e.g., the calibration unit). In the star architecture shown, which test signals may be expected would then be calculated from the complex sum of the individual transmit signals. Whether the test signal actually received behind the star connection unit corresponds to the signal calculated beforehand may be checked. However, without restricting the generality, the case is assumed for the following examples, whereby the receive chain of the MR antenna elements is to be tested.

In order to reduce the number of test antennas 6 in the local coil 2 and provide a clear assignment of the phase responses, so that, for example, even if a flexible local coil is reshaped, the phase response between a test antenna 6 and an assigned magnetic resonance antenna element 2 does not change, the test antennas 6 may be assigned respectively to a group of MR antenna elements 2. Each of the assigned MR antenna elements 2 may thus overlap a local coil 6.

This is shown in FIG. 4 for each of two MR antenna elements 2 in a group, with two MR antenna elements 2 at a time overlapping one another and a test antenna 6 being arranged in a joint overlapping area 2U for each of these pairs of MR antenna elements 2 of the group.

Figure 5:
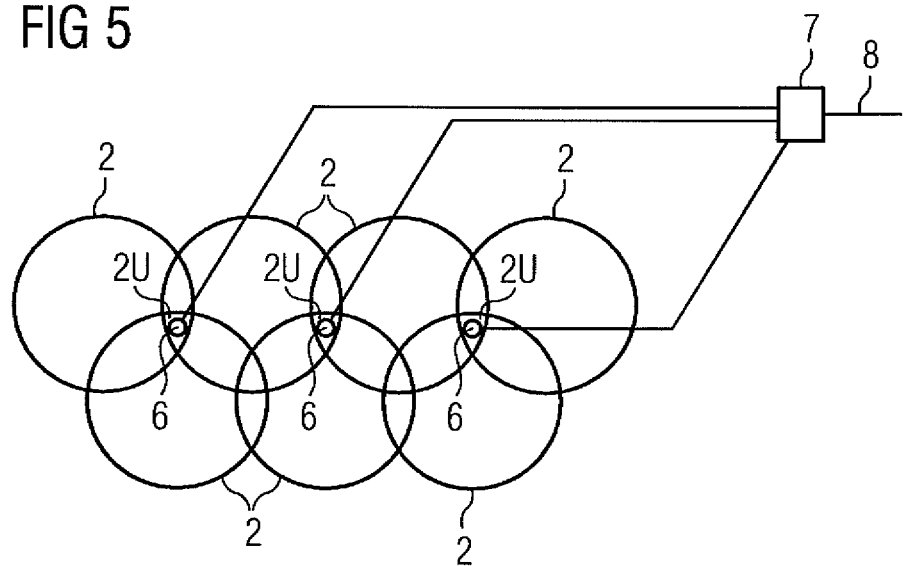
FIG. 5 shows a third exemplary embodiment of a plurality of MR antenna elements with assigned test antennas.

FIG. 5 shows one embodiment of an arrangement for three MR antenna elements 2 overlapping at a time. At least three MR elements 2 overlap at a time, and the test antennas 6 are accordingly located in a joint overlapping area 2U of three adjacent MR antenna elements 2.

Figure 6:
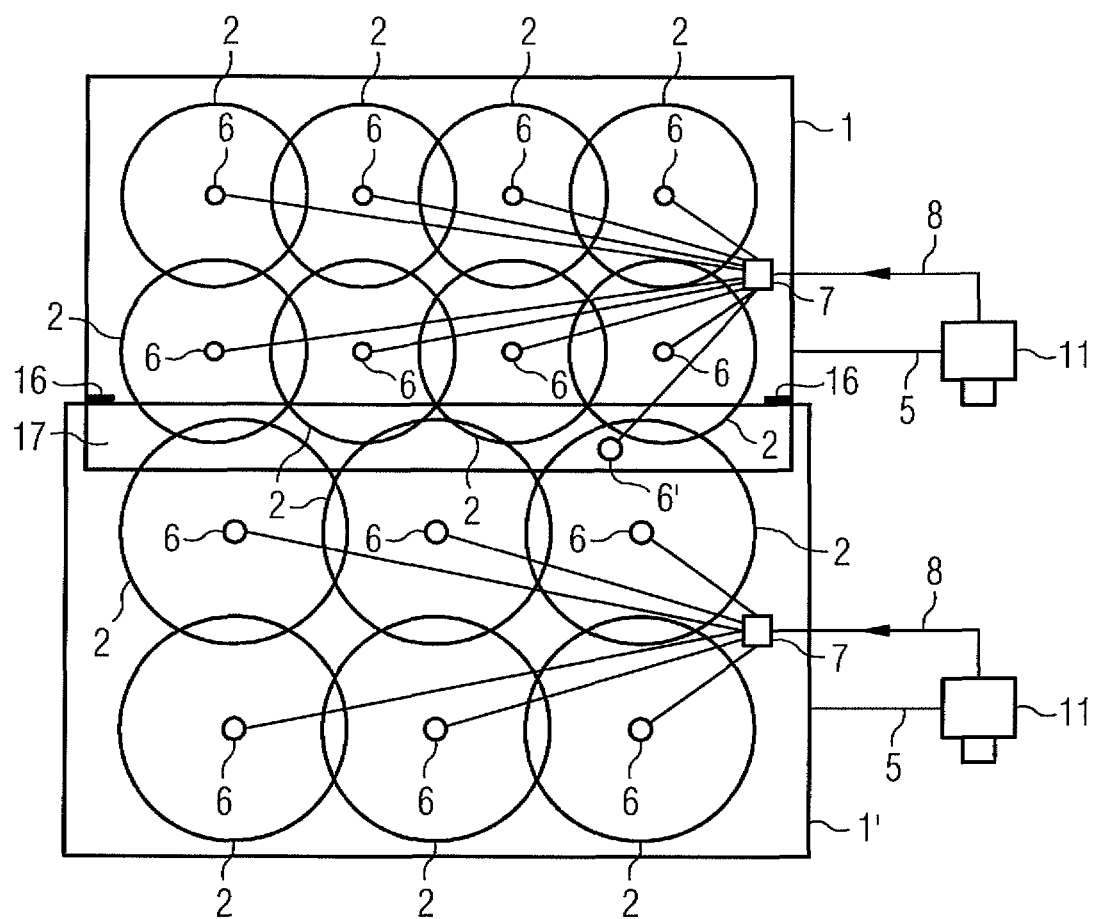
FIG. 6 shows an exemplary embodiment of two adjacent local coils each with a plurality of MR antenna elements and assigned test antennas and an additional test antenna in an overlapping area of the local coils.

FIG. 6 shows a possibility for the phase responses relative to one another also to be determined across two adjacent local coils 1, 1'. The individual local coils 1, 1' are constructed analogously to the local coil 1 according to FIG. 3, with one of the local coils 1, for example, having eight MR antenna elements 2, and the other local coil 1' having only six MR antenna elements 2. For greater clarity, the switching of the MR antenna elements 2 to the digital output 5 is not shown. Instead, the figure shows that the digital output 5 is joined together with a test signal connector 8 in a joint coil connector 6 in order to have only one connector mechanically, this making connection easier in daily clinical operation.

A difference to the exemplary embodiment according to FIG. 3 is that the local coil 1 shown at the top of FIG. 6 has, in a marginal area, an additional test antenna 6' that is not assigned to any magnetic resonance antenna element 2 of the local coil 1. The local coil 1 is provided with position markings 16 on an outer housing of the local coil 1. An operator who positions the local coils on the patient may provide that the second local coil 1' overlaps precisely with the first local coil 1 so that the edge of the second local coil 1' is located at the position markings 16. Corresponding position markings may also be provided on the second local coil 1'.

If the two local coils 1, 1' are arranged compatibly with one another, this provides that the test antenna 6' of the first local coil 1, which is located in the marginal area, is completely overlapped by a magnetic resonance antenna element 2 of the second local coil 1' (e.g., the test antenna 6' is located within the active area of the relevant magnetic resonance antenna element 2 of the second local coil 1'). The relative phase responses of the MR antenna elements 2 to one another within the first local coil and to one another within the second local coil 1' may be determined by emission of corresponding test signals. Also, for the relative phase response of the magnetic resonance antenna element 2 of the second local coil 1' that overlaps the additional test antenna 6' of the first local coil 1, the relative phase responses of the MR antenna elements 2 to one another within the first local coil and to one another within the second local coil 1' may be determined relative to the phase responses of the MR antenna elements 2 of the first local coil 1. Thus, all phase responses relative to one another may be determined.

FIG. 7 shows an alternative embodiment of a capacitive test signal coupling unit 9. This test signal coupling unit 9 is implemented, for example, in the form of a direct connection to the conductive path of the magnetic resonance antenna element 2, with the cable being connected via two capacitors C1, C2 (e.g., condensers) connected respectively on the right and left of one of the capacitors C3 inside the conductor loop of the magnetic resonance antenna element 2. The two capacitive elements C1, C2 are smaller than the capacitive element C3, for example, with a magnetic field of 3 tesla in the order of below 2 pF.

A further alternative is shown in FIG. 8, where the test signal coupling unit 10 is implemented as a galvanic connection of a test signal cable via a switch immediately before the one preamplification input 3 of the MR antenna element 2. Since the main part of the phase response occurs in the preamplifier 3, a test signal TS may be galvanically fed in directly.

FIG. 9 shows an exemplary embodiment, with which the cabling within the local coil 1 may be reduced. Each magnetic resonance antenna element 2 is assigned its own test antenna 6. This is, however, connected via a line 12 with filter elements 15 in the form of a capacitive element and of an inductive element behind the postprocessing unit 4' to a transmission cable 13 for the respective magnetic resonance antenna element. A star connection unit 7' is located on the side of the magnetic resonance system from where a test signal that is applied at the test signal connector 8' is distributed and, via corresponding switching elements, for example, via a line 14 with filter elements 15 in the form of a capacitive element and an inductive element, is fed into the transmission line 13 and thus transferred to the local coil 1.

In addition, the transmission cable 13 is used in the normal way in order to transfer the digitized raw data coining from the postprocessing unit 4' at an output 5' of the cable to a receiving unit in the magnetic resonance system. Such a transfer of the test signal via the transmission cable 13 of the respective MR antenna elements 2 is then possible if the test signal has a different frequency than the raw data (e.g., if (as in this case) the signal was digitized beforehand in the postprocessing device 4' or at least was converted to a different frequency). A multiplex process, for example, may be used in this case.

FIG. 10 again shows a flowchart for executing one embodiment of a method. In a calibration phase KP, a test signal is emitted in the magnetic resonance frequency in act I. This is received simultaneously by all magnetic resonance coil elements of a local coil in act II.

In act III, the received test signals are analyzed to determine the relative phase differences (e.g., the test signal determined by a reference magnetic resonance antenna element 2 is used as a reference signal, and the differences in relation to the test signals received by the other magnetic resonance receiver elements are determined in each case).

In act IV, a correction of the determined phase differences then takes place with regard to the phase differences of the test signals generated on the test line. For this purpose, in act V, the phase differences are read out from a memory, in which the phase differences were previously stored as a priori knowledge.

In act VI, a phase correction matrix may be generated for all coil elements. The phase shift for each individual magnetic resonance antenna element in relation to every other magnetic resonance antenna element is entered in the phase correction matrix.

The phase correction matrix may then be used later at any point in time during a magnetic resonance measurement MM in act IX in order to correct the magnetic resonance signals measured in act VII received via the various MR antenna elements 2. For example, in act IX, using complex weighting coefficients that, for example, were read out from a memory previously in act VIII, the required modes, which are output in act X as mode signals for further processing, may be generated. The complex weighting coefficients for the mode formation may also be determined taking into account the region of interest (ROI). For this purpose, the operator may specify an ROI (e.g., via the terminal), or the processor detects the relevant anatomical region on the basis of a prescan image. The mode formation may be adjusted so that the SNR is maximized in the ROI. Detailed embodiments of this may be found in DE 10 2009 012 109, to which reference is made here in full. The corresponding US patent application publication is 2010/0225317, which is hereby incorporated by reference in its entirety.

In one embodiment, this mode formation may also extend beyond individual coil housings if two coils are attached as described above at a mechanically defined distance, and the corresponding calibration phases to one another have been determined and stored (e.g., likewise in the phase correction matrix).

The structures described above are merely exemplary embodiments, and the basic principle may also be varied widely by a person skilled in the art without departing from the scope of the invention. For example, explicit reference is made to the fact that the variants of the method and devices described above (e.g., the arrangements of the MR antenna elements and the test signal coupling units in the local coils) may also be used in any combination with one another. The use of the indefinite articles "a" and "an" does not signify that the features concerned may not also exist in multiples. In the same way, the term "unit" does not exclude the possibility that the unit may include several components that may also be spatially distributed.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance system comprising:
   a local coil comprising
      a plurality of magnetic resonance antenna elements; and
      a plurality of test signal coupling units assigned individually or in groups to the plurality of magnetic resonance antenna elements, wherein each test signal coupling unit of the plurality of test signal coupling units is for transmitting a test signal and is connected via a star connection unit to a joint test signal connector, a transmission cable of a transmit chain, a receive chain, or a transmit and receive chain of an assigned magnetic resonance antenna element of the plurality of magnetic resonance, or the joint test signal connector and the transmission cable, and wherein each magnetic resonance antenna element of the plurality of magnetic resonance antenna elements is connected via the receive chain to a receiving device of the magnetic resonance system, via the transmit chain to a high-frequency transmission device of the magnetic resonance system, or a combination thereof;

a test signal transmission interface operable to:
  inject defined test signals via the plurality of test signal coupling units into the plurality of magnetic resonance antenna elements in a calibration operation; or
  cause a defined test signal to be emitted by the plurality of magnetic resonance antenna elements via the respective transmit chain assigned to the magnetic resonance antenna element;
a test signal receiving interface operable to receive the defined test signals injected via the plurality of test signal coupling units into the plurality of magnetic resonance antenna elements in the calibration operation, or the defined test signals emitted by the plurality of magnetic resonance antenna elements and detected by the respective test signal coupling units; and
an analysis unit configured to determine current relative phase responses of the receive chains of the individual magnetic resonance antenna elements of the plurality of magnetic resonance antenna elements on the basis of the defined test signals injected into the plurality of magnetic resonance antenna elements, determine current relative phase responses of the transmit chains of the individual magnetic resonance antenna elements of the plurality of magnetic resonance antenna elements on the basis of the respective test signals detected by the test signal coupling units.

2. A method for recording calibration data of a magnetic resonance system, the magnetic resonance system comprising a local coil with a plurality of magnetic resonance antenna elements, each magnetic resonance antenna element of the plurality of magnetic resonance antenna elements being connected via a receive chain to a receiving device of the magnetic resonance system, via a transmit chain to a high-frequency transmission device of the magnetic resonance system, or via the receive chain and the transmit chain, test signal coupling units being respectively assigned individually or in groups to the plurality of magnetic resonance antenna elements, the method comprising:
  injecting a defined test signal via a plurality of test signal coupling units into the plurality of magnetic resonance antenna elements, wherein the defined test signal is fed at a joint test signal connector and distributed via a star connection unit to the plurality of test signal coupling units in the local coil, or fed at the joint test signal connector, distributed via the star connection unit to the plurality of test signal coupling units in the local coil, and transferred to the plurality of test signal coupling units via a transmission cable of a receive chain of a magnetic resonance antenna element of the plurality of magnetic resonance antenna elements that is assigned to the test signal coupling unit;
  receiving the test signals injected into the plurality of magnetic resonance antenna elements and sent back to the receiving device via the receive chains respectively assigned to the plurality of magnetic resonance antenna elements; and
  determining current relative phase responses of the receive chains of the individual magnetic resonance antenna elements of the plurality of magnetic resonance antenna elements on the basis of the test signals; or
  emitting a defined test signal by the plurality of magnetic resonance antenna elements, respectively, via the transmit chain assigned to the respective magnetic resonance antenna element of the plurality of magnetic resonance antenna elements;
  receiving the test signals emitted by the plurality of magnetic resonance antenna elements and detected by the respective test signal coupling units, wherein the test signals received by the various test signal coupling units are linked in a star connection unit and output at a joint test signal connector, or are linked in the star connection and transferred via a transmission cable of the transmit chain of a magnetic resonance antenna element of the plurality of magnetic resonance antenna elements assigned to the test signal coupling unit; and
  determining current relative phase responses of the transmit chains of the individual magnetic resonance antenna elements of the plurality of magnetic resonance antenna elements on the basis of the test signals.

3. The method as claimed in claim 2, further comprising determining a current phase correction matrix on the basis of the current relative phase responses of the receive chains, the transmit chains, or the receive chains and the transmit chains.

4. The method as claimed in claim 2, further comprising:
  injecting the defined test signal, in a calibration operation, by a test antenna arranged in a marginal area of a first local coil, into a magnetic resonance antenna element of an adjacently arranged second local coil, or receiving the defined test signal emitted by the magnetic resonance antenna element of the adjacently arranged local coil, and
  determining the relative phase responses of the receive chains, the transmit chains, or the receive chains and the transmit chains of the magnetic resonance antenna elements of the first local coil and second local coil to one another.

5. The method as claimed in claim 4, wherein the first local coil and the second local coil are positioned with a defined overlap in relation to one another.

6. The method as claimed in claim 3, further comprising:
  injecting the defined test signal, in a calibration operation, by a test antenna arranged in a marginal area of a first local coil, into a magnetic resonance antenna element of an adjacently arranged second local coil, or receiving the defined test signal emitted by the magnetic resonance antenna element of the adjacently arranged local coil, and
  determining the relative phase responses of the receive chains, the transmit chains, or the receive chains and the transmit chains of the magnetic resonance antenna elements of the first local coil and second local coil to one another.

* * * * *